United States Patent
Fu et al.

(10) Patent No.: US 10,972,012 B2
(45) Date of Patent: Apr. 6, 2021

(54) CONTROL CIRCUIT AND CONTROL METHOD OF FLYBACK CONVERTER

(71) Applicant: Delta Electronics (Shanghai) Co., Ltd., Shanghai (CN)

(72) Inventors: Xiaoping Fu, Shanghai (CN); Xinghua Zhang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/118,480

(22) Filed: Aug. 31, 2018

(65) Prior Publication Data

US 2019/0089255 A1    Mar. 21, 2019

(30) Foreign Application Priority Data

Sep. 20, 2017    (CN) .......................... 201710854750.9

(51) Int. Cl.
*H02M 3/335*    (2006.01)
*H03M 1/12*    (2006.01)
(Continued)

(52) U.S. Cl.
CPC ......... *H02M 3/33515* (2013.01); *H02M 1/08* (2013.01); *H03M 1/1245* (2013.01); *H02M 2001/0009* (2013.01)

(58) Field of Classification Search
CPC . H02M 2001/0003; H02M 2001/0009; H02M 2001/0012; H02M 1/08;
(Continued)

(56) References Cited

U.S. PATENT DOCUMENTS 7,505,287 B1* 3/2009 Kesterson ......... H02M 3/33507
                                                       363/21.01
7,558,093 B1* 7/2009 Zheng ............... H02M 3/33515
                                                       363/21.12
(Continued)

FOREIGN PATENT DOCUMENTS

CN        103298215 A    9/2013
CN        103795255 A    5/2014
(Continued)

OTHER PUBLICATIONS

Corresponding China office action dated Dec. 30, 2019.

*Primary Examiner* — Thienvu V Tran
*Assistant Examiner* — Shahzeb K Ahmad
(74) *Attorney, Agent, or Firm* — CKC & Partners Co., LLC

(57)    ABSTRACT

Embodiments of the present application provide a control circuit and a control method of a flyback converter, the control circuit comprises: a first sampling module, a second sampling module, and a control module; the first sampling module is coupled to the control module and the flyback converter, and outputs a first voltage signal to the control module; the second sampling module is coupled to the control module and the flyback converter, and outputs a second voltage signal to the control module; where the first voltage signal reflects an input voltage of the flyback converter, the second voltage signal reflects an output voltage of the flyback converter; the control module outputs a control signal according to the first voltage signal and the second voltage signal, and the control signal reflects a turn-on time of the switch in the flyback converter.

9 Claims, 6 Drawing Sheets

(51) Int. Cl.
*H02M 1/08* (2006.01)
*H02M 1/00* (2006.01)

(58) Field of Classification Search
CPC ............... H02M 3/335; H02M 3/3353; H02M 3/33523; H02M 3/33515; H02M 3/33507–33592; H03M 1/1245
See application file for complete search history.

(56) References Cited

U.S. PATENT DOCUMENTS

| | | | |
|---|---|---|---|
| 2013/0329468 A1* | 12/2013 | Yang | H02M 3/33523 363/21.15 |
| 2014/0119066 A1* | 5/2014 | Lin | H02M 3/33523 363/21.15 |
| 2014/0204622 A1* | 7/2014 | Telefus | H02M 3/33523 363/21.02 |
| 2014/0368167 A1* | 12/2014 | Okura | H02J 5/005 320/109 |
| 2016/0172981 A1* | 6/2016 | Gritti | H05B 45/37 363/21.12 |
| 2018/0226893 A1* | 8/2018 | Balakrishnan | H01L 23/49575 |
| 2018/0279431 A1* | 9/2018 | Schaemann | H02M 3/33523 |
| 2019/0393792 A1* | 12/2019 | Toyoda | H02M 3/33523 |

FOREIGN PATENT DOCUMENTS

| | | |
|---|---|---|
| CN | 104092384 A | 10/2014 |
| CN | 105006973 A | 10/2015 |

\* cited by examiner

US 10,972,012 B2

CONTROL CIRCUIT AND CONTROL METHOD OF FLYBACK CONVERTER

CROSS-REFERENCE TO RELATED APPLICATION

This application claims priority to Chinese Patent Application No. 201710854750.9, filed on Sep. 20, 2017, which is hereby incorporated by reference in its entirety.

TECHNICAL FIELD

Embodiments of the present application relate to the field of electric power, and more particularly, to a control circuit and a control method of a flyback converter.

BACKGROUND

At present, a flyback converter, especially an isolated flyback converter is widely used in the field of dimming.

FIG. 1A is a topology diagram of an isolated flyback converter and a primary side auxiliary circuit, where the flyback converter may include a primary side winding, a secondary side winding, a secondary side diode D, a capacitor C, a resistor $R_L$, a switch M and a resistor Rs. An input voltage Vin is provided between an input end of the flyback converter and a ground end of the primary side. By controlling a turn-on time of the switch M, a voltage Vo is finally output to a load, such as a load resistor $R_L$ in FIG. 1A. Specifically, as shown in FIG. 1A, a first end of the primary side winding is coupled to the input end of the flyback converter, a second end of the primary side winding is coupled to a first end of the switch M, a second end of the switch M is coupled to the resistor Rs, a first end of the secondary side winding is connected to an anode of the secondary side diode D, a cathode of the secondary side diode D is connected to a first end of the capacitor C, a second end of the capacitor C is connected to a second end of the secondary side winding, and the load resistor $R_L$ is connected in parallel with the capacitor C. The switch M is a full controlled device, such as a MOSFET, an IGBT, a GTO and etc. Referring still to FIG. 1A, the primary side auxiliary circuit further includes an auxiliary winding coupled to the primary side winding of a transformer of the flyback converter.

In the prior art, an output current $I_O$ is usually controlled by controlling a primary side peak current $I_{pk}$, that is, the output current $I_O$ is controlled according to an equation $$I_O = \frac{t_D}{2t_S} \frac{N_P}{N_S} I_{pk},$$

where $t_D$ is turn-on time of the secondary side diode D of the flyback converter, $t_S$ is a switching cycle of the switch M of the flyback converter, $N_P$ is the number of turns of the primary side winding of the flyback converter, $N_S$ is the number of turns of the secondary side winding of the flyback converter, and $I_{pk}$ is the primary side peak current. It needs to sample $I_{pk}$ when the output current is controlled. However, there is a parasitic capacitance in the switch, resulting in a peak current in a turn-on moment of the switch, which may lead to a false triggering, especially when $I_{pk}$ is small. So the sampling range of $I_{pk}$ is narrow and it is difficult to achieve a wide range of dimming. In addition, in order to obtain $t_D$, it's required to detect a zero-crossing point of a secondary side current, and the detection of the zero-crossing point is usually converted to a detection of a zero-crossing point of a ringing voltage of the auxiliary winding. Due to the ringing and sampling delay, there is a delay between an actually obtained $t_D$ and a theoretical $t_D$.

FIG. 1B is a topology diagram of a non-isolated flyback converter, which also controls an output current $I_O$ by controlling a primary peak current $I_{pk}$ in the prior art. Similarly, due to a narrow sampling range of $I_{pk}$ and a delay in a sampling of a zero-crossing point of the secondary side current, so it is also hard to obtain a higher control accuracy.

In summary, the control method of the flyback converter in the prior art has an error in terms of sampling the current, resulting in that the control accuracy of the output current cannot satisfy the requirement of the practical application.

SUMMARY

Embodiments of the present application provide a control circuit and a control method of a flyback converter, thereby solving the technical problem in the prior art that the control circuit of the flyback converter has an error on the sampling of the current.

In a first aspect, an embodiment of the present application provides a control circuit for a flyback converter, including:
a first sampling module, a second sampling module, and a control module;
the first sampling module being coupled to the control module and the flyback converter respectively, and outputting a first voltage signal to the control module;
the second sampling module being coupled to the control module and the flyback converter, respectively, and outputting a second voltage signal to the control module;
where, the first voltage signal reflects an input voltage of the flyback converter, the second voltage signal reflects an output voltage of the flyback converter; the control module outputs a control signal according to the first voltage signal and the second voltage signal, and the control signal reflects a turn-on time of the switch in the flyback converter.

In the embodiments of the present application, the control module may control the turn-on time of the switch according to the input voltage and the output voltage of the flyback converter, thereby controlling the output current of the circuit, avoiding an error of a current sampling in the prior art, improving a controlling accuracy of the output current, and satisfying the requirement of the practical application.

In a second aspect, an embodiment of the present application provides a control method of a flyback converter, including:
receiving a first voltage signal and a second voltage signal;
controlling a turn-on time of a switch of the flyback converter according to a instruction signal, the first voltage signal and the second voltage signal;
where the first voltage signal reflects an input voltage of the flyback converter, the second voltage signal reflects an output voltage of the flyback converter, and the instruction signal reflects an expected value of an output current of the flyback converter.

In the embodiments of the present application, the control module may control the turn-on time of the switch according to the input voltage and the output voltage of the flyback converter, thereby controlling the output current of the control circuit, avoiding an error of a current sampling in the prior art, improving a controlling accuracy of the output current, and satisfying the requirement of the practical application.

Since the control module may control the turn-on time of the switch according to the input voltage and output voltage of the flyback converter, so as to control an output current of the flyback converter. As such, a phenomenon in the prior art that the control circuit of the flyback converter has an error on the sampling of the current is avoided, and the control accuracy of the output current is enhanced, which satisfies the requirement of the practical application.

BRIEF DESCRIPTION OF DRAWINGS

In order to more clearly state the technical solutions of the embodiments in the present application or related art, the accompanying drawings used in the descriptions of the embodiments or the related art will be briefly illustrated, and apparently, the accompanying drawings described below are some embodiments of the present application, and for persons skilled in the art, other drawings may be obtained based on these drawings without any creative effort.

DETAILED DESCRIPTION

In order to render a clearer description of the purpose, technical solutions and advantages of embodiments of the present application, the technical solutions in the embodiments of the present application will be described clearly and completely as follows in conjunction with drawings accompanying the embodiments of the present application. And apparently, the described embodiments are just part rather than all of the embodiments of the present application. All the other embodiments acquired by one with ordinary skill in the art based on the embodiments of the present application without delivering creative efforts shall fall into the protection scope claimed by the present application.

In order to solve the problem in the prior art that the control circuit of the flyback converter has an error on the sampling of the current, an embodiment of the present application provides a control circuit of a flyback converter.

Figure 1A:
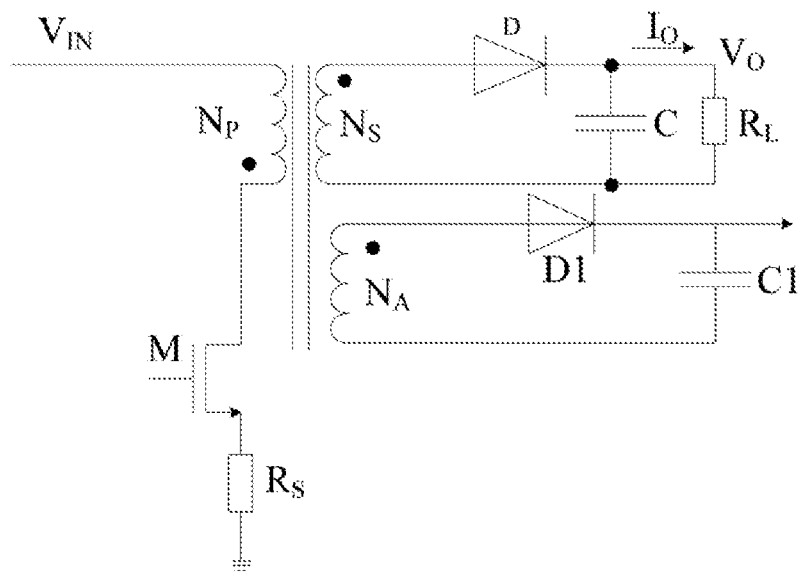
FIG. 1A is a topology diagram of an isolated flyback converter and a primary side auxiliary circuit.
Figure 1B:
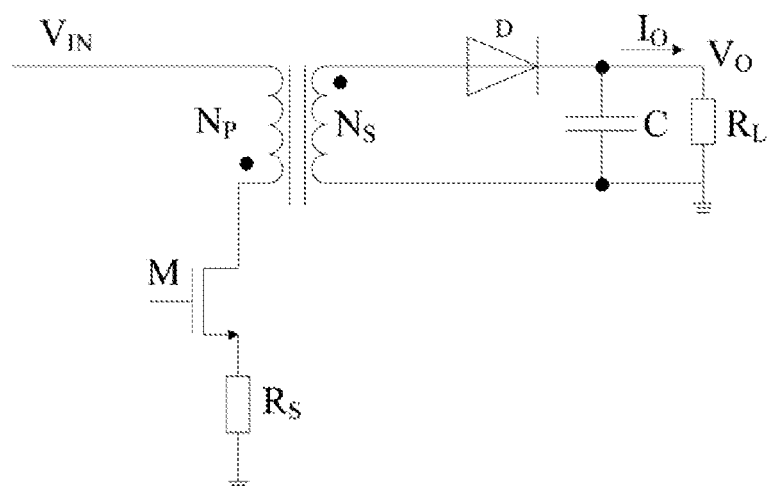
FIG. 1B is a topology diagram of a non-isolated flyback converter.

Before describing the specific implementation of the present application, a principle of a constant current used in the present application is first explained:

As shown in FIG. 1A and FIG. 1B, those skilled in the art may understand that when the flyback converter works in a discontinuous mode, a formula (1) and a formula (2) are obtained according to a basic principle of the flyback converter. When a switch M is turned on, a formula (3) is obtained. When the switch M is turned off and a diode D is turned on, a formula (4) is obtained.

$$L_S = L_P * \left(\frac{N_S}{N_P}\right)^2 \quad (1)$$

$$I_{D\_pk} = \frac{N_P}{N_S} * I_{pk} \quad (2)$$

$$I_{pk} = \frac{V_{IN}}{L_P} t_{on} \quad (3)$$

$$I_{D\_pk} = \frac{V_O + V_F}{L_S} t_D \quad (4)$$

Formulas (1), (2) and (3) are substituted to the formula (4) to obtain a formula (5):

$$t_D = I_{D\_pk} \frac{L_S}{V_o + V_F} = \left(\frac{N_P}{N_S} \frac{V_{IN}}{L_P} t_{on}\right) \frac{L_P}{\left(\frac{N_P}{N_S}\right)^2 (V_o + V_F)} = \frac{V_{IN}}{L_P} t_{on} \frac{L_P}{\frac{N_P}{N_S}(V_o + V_F)} \quad (5)$$

Then a formula (6) is obtained according to the basic principle of the flyback converter:

$$I_{out} = \frac{t_D}{2t_S} \frac{N_P}{N_S} I_{pk} \quad (6)$$

The formula (5) is substituted to the formula (6) to obtain a formula (7):

$$I_{out} = \frac{t_D}{2t_S} \frac{N_P}{N_S} I_{pk} = \frac{V_{IN}}{L_P} t_{on} \frac{L_P}{\frac{N_P}{N_S}(V_o + V_F)} \frac{1}{2t_S} \frac{N_P}{N_S} \frac{V_{IN}}{L_P} t_{on} \quad (7)$$

Finally simplified as a formula (8):

$$I_{out} = \frac{V_{IN}^2 t_{on}^2}{2t_S(V_o + V_F)L_P}. \quad (8)$$

where, $L_S$ is an inductance of a secondary side winding of the flyback converter, $L_P$ is an inductance of a primary side winding of the flyback converter, $N_S$ is the number of turns of the secondary side winding of the flyback converter, $N_P$ is the number of turns of the primary side winding of the flyback converter, $I_{D\_pk}$ is a peak current of a secondary side diode D of the flyback converter, $I_{pk}$ is a primary side peak current, $V_{IN}$ is an input voltage of the flyback converter, $t_{on}$ is a turn-on time of the switch M, $V_O$ is an output voltage of the flyback converter, $V_F$ is a turn-on voltage drop of the diode D, $t_D$ is a turn-on time of the diode D, $I_{out}$ is an output current, and $t_S$ is an switching cycle of the switch M.

From formula (8), it can be seen that the output current $I_{out}$ is determined by the input voltage $V_{IN}$, the output voltage $V_O$, the switching cycle $t_S$, the turn-on voltage drop $V_F$ of diode D, the inductance $L_P$ of the primary side winding and the turn-on time $t_{on}$ of the switch M.

If the input voltage $V_{IN}$ and the output voltage $V_O$ are obtained, and $V_F$, $L_P$ and $t_S$ are the known circuit parameters of the flyback converter, then $I_{out}$ can be controlled by controlling $t_{on}$, and the above is the principle of constant current controlling.

In the present embodiment, formula (11-1) can be obtained according to formula (8):

$$t_{on} = \frac{\sqrt{2t_s(V_o + V_F)L_P I_{out}}}{V_{IN}} \quad (11\text{-}1)$$

Further, if an expected value of the output current $I_{out}$ is given as $I^*_{out}$, formula (11-2) can be got as follows:

$$t_{on} = \frac{\sqrt{2t_s(V_o + V_F)L_P I^*_{out}}}{V_{IN}} \quad (11\text{-}2)$$

According to formula (11-2), the turn-on time $t_{on}$ corresponding to the $I^*_{out}$ can be calculated via the input voltage $V_{IN}$ and the output voltage $V_O$. Thus, the control module can control the turn-on time of the switch according to the input voltage and the output voltage of the flyback converter, so as to control an output current of the flyback converter, thus avoiding the error on the current sampling in the prior art, improving the control accuracy of the output current, and satisfying the requirement of the practical application.

Figure 2:
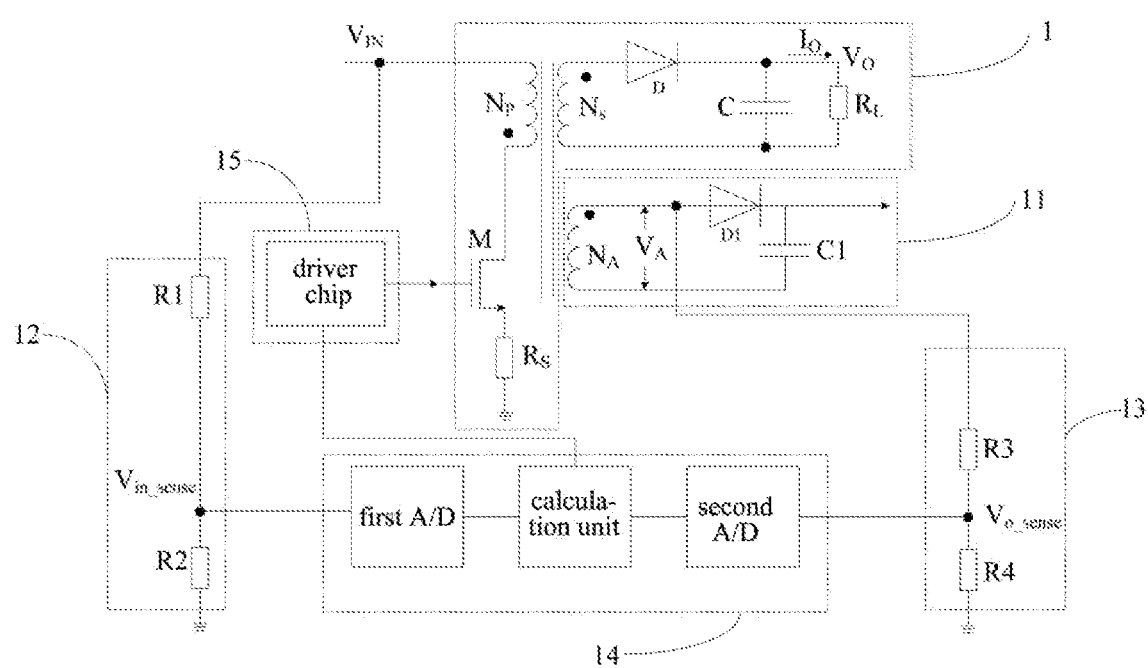
FIG. 2 is a topology diagram of a control circuit of a flyback converter according to an embodiment of the present application

FIG. 2 is a topology diagram of a control circuit of a flyback converter provided by an embodiment of the present application. As shown in FIG. 2, the flyback converter is an isolated flyback converter, and a primary side and a secondary side are not commonly grounded. The topology of the control circuit of the flyback converter includes: a primary side auxiliary circuit 11, a first sampling module 12, a second sampling module 13 and a control module 14, where the primary side auxiliary circuit 11 includes an auxiliary winding, and the auxiliary winding is wound around a primary side of a transformer of the flyback converter 1; the first sampling module 12 is coupled to the primary side winding of the flyback converter 1; the second sampling module 13 is coupled to the flyback converter through the primary side auxiliary circuit; the control module 14 is respectively coupled to the first sampling module 12 and the second sampling module 13, for receiving a first voltage signal provided by the first sampling module 12 and a second voltage signal provided by the second sampling module 13; the control module 14 is configured to output a control signal according to the first voltage signal and the second voltage signal, and the control signal reflects a turn-on time of the switch of the flyback converter 1; where, the first voltage signal reflects an input voltage $V_{IN}$ of the flyback converter, and the second voltage signal reflects an output voltage $V_O$ of the flyback converter.

Alternatively, the control module 14 includes: a first A/D conversion module, a calculation unit and a second A/D conversion module; where, the first A/D conversion module is respectively coupled to the first sampling module and the calculation unit; the second A/D conversion module is respectively coupled to the second sampling module and the calculation unit; the first A/D conversion module converts the first voltage signal to a first digital signal, and outputs the first digital signal to the calculation unit; the second A/D conversion module converts the second voltage signal to a second digital signal, and outputs the second digital signal to the calculation unit. The calculation unit may calculate the turn-on time of the switch in the flyback converter according to the first digital signal and the second digital signal, so as to control the output current of the flyback converter.

Where, the calculation unit may be a microprocessor, such as a Central Processing Unit (CPU) or a Microcontroller Unit (MCU). Of course, the control module 14 may also use other microprocessors.

Alternatively, the first sampling module 12 includes a first resistor R1 and a second resistor R2. Where, one end of the first resistor R1 is coupled to an input end of the flyback converter, the other end of the first resistor R1 is coupled to the second resistor R2. One end of the second resistor R2 is coupled to the first resistor R1, the other end of the second resistor R2 is grounded, and a coupling point between the first resistor R1 and the second resistor R2 is coupled to the control module. After the input voltage $V_{IN}$ is divided by the first resistor R1 and the second resistor R2, the divided voltage is provided to the control module, that is, the first voltage signal $V_{IN\_Sense}$ is output to the control module.

Alternatively, referring still to FIG. 2, the primary side auxiliary circuit may include an auxiliary winding, a diode D1 and a capacitor C1, where an anode of the diode D1 is coupled to a first end of the auxiliary winding, a cathode of the diode D1 is coupled to one end of the capacitor C1, and the other end of the capacitor C1 is coupled to a second end of the auxiliary winding. The second sampling module 13 includes a third resistor R3 and a fourth resistor R4; where one end of the third resistor R3 is coupled to the first end of the auxiliary winding, the other end of the third resistor R3 is coupled to the fourth resistor R4, one end of the fourth resistor R4 is coupled to the third resistor R3, the other end of the fourth resistor R4 is grounded, and a coupling point between the third resistor R3 and the fourth resistor R4 is coupled to the control module 14. After the voltage $V_A$ of the auxiliary winding is divided by the third resistor R3 and the fourth resistor R4, the divided voltage is provided to the control module, that is, the second voltage signal $V_{O\_Sense}$ is output to the control module.

The relationship between the voltage $V_A$ of the auxiliary winding and the output voltage $V_O$ is shown as formula (9), and formula (10) can be obtained according to formula (9):

$$V_A = \frac{N_A}{N_S} \times (V_O + V_F) \quad (9)$$

$$V_O = V_A \frac{N_S}{N_A} - V_F \quad (10)$$

Where $N_A$ is the number of turns of the auxiliary winding. For the isolated flyback converter, the second voltage signal reflecting the output voltage $V_O$ can be obtained by detecting the voltage $V_A$ of the auxiliary winding since $N_S$, $N_A$ and $V_F$ are the known circuit parameters.

Alternatively, as shown in FIG. 2, the control circuit further includes a driver module 15, where the driver module may be a driving chip or other driving circuit, and the present application is not limited thereto. The driver module 15 is respectively coupled to the control module 14 and the flyback converter 1, and the driver module 15 converts the control signal output by the control module 14 into a driving signal, so as to drive the switch in the flyback converter to be turned-on and turned-off.

When the sampling circuit as shown in FIG. 2 is used, the control module may further calculate the turn-on time $t_{on}$ according to formula (11-2):

$$t_{on} = \frac{\sqrt{2t_s \frac{R3+R4}{R4} V_{O\_Sense} \frac{N_S}{N_A} L_P I^*_{out}}}{\frac{R1+R2}{R2} V_{IN\_Sense}} \quad (12)$$

Where R1 is a resistance value of the first resistor, R2 is a resistance value of the second resistor, R3 is a resistance value of the third resistor, R4 is a resistance value of the fourth resistor, $V_{IN\_Sense}$ is the first voltage signal, and $V_{O\_Sense}$ is the second voltage signal, $I^*_{out}$ is an expected value of the output current $I_{out}$.

In this embodiment, formula (12) shows that the corresponding turn-on time $t_{on}$ of the switch M can be calculated according to the values of $V_{IN\_Sense}$ and $V_{O\_Sense}$, so as to achieve the purpose of controlling the output current $I_{out}$.

Figure 3:
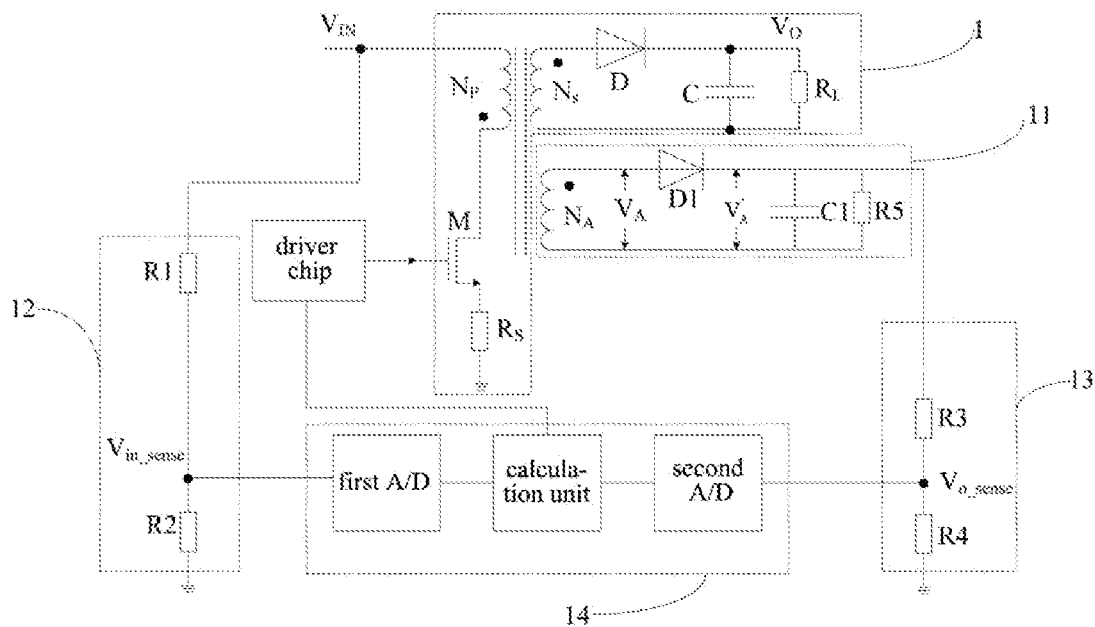
FIG. 3 is a topology diagram of a control circuit of a flyback converter according to another embodiment of the present application.

FIG. 3 is a topology diagram of a control circuit of a flyback converter according to another embodiment of the present application. Most of the structures shown in FIG. 3 are the same as those shown in FIG. 2, and only different parts thereof will be described. The second sampling module 13 includes a third resistor R3 and a fourth resistor R4; where one end of the third resistor R3 is coupled to a cathode of the primary diode D1, the other end of the third resistor R3 is coupled to the fourth resistor R4. One end of the fourth resistor R4 is coupled to the third resistor R3, and the other end of the fourth resistor R4 is grounded. A coupling point between the third resistor R3 and the fourth resistor R4 is coupled to the control module 14, and outputs a second voltage signal $V_{O\_Sense}$ to the control module. The second sampling module may further include a fifth resistor R5, where the fifth resistor R5 and the capacitor C1 are coupled in parallel. The diode D1, the capacitor C1 and the fifth resistor R5 can be used for smoothing a second sampling voltage, so as to prevent sampling an oscillation point.

Further, the number of turns of the auxiliary winding of the primary side can be set to be the same as the number of turns of the secondary side winding of the flyback converter, and/or the turn-on voltage drop of the diode D1 of the primary side auxiliary circuit can be set to be the same as the turn-on voltage drop of the secondary side diode D of the flyback converter.

When the number of turns of the auxiliary winding of the primary side is set to be the same as the number of turns of the secondary side winding of the flyback converter, and simultaneously the turn-on voltage drop of the diode D1 of the primary side auxiliary circuit can be set to be the same as the turn-on voltage drop of the secondary side diode D of the flyback converter, formula (13) and formula (14) can be obtained according to formula (10):

$$V_O = V_A - V_F = V'_A \quad (13)$$

$$V_O = V_{O\_Sense} * \frac{R3+R4}{R4} \quad (14)$$

From formula (13) and formula (14), it can be known that only $V_{O\_Sense}$ needs to be controlled to control the output voltage $V_O$ since the output voltage $V_O$ is only related to R3, R4 and $V_{O\_Sense}$, thereby offsetting the influence of the turn-on voltage drop V of the output diode. In the present embodiment, according to the second sampling circuit shown in FIG. 3, a more accurate output voltage $V_O$ can be obtained via sampling.

According to formula (11-2) and formula (14), formula (15) can be obtained as:

$$t_{on} = \frac{\sqrt{2t_s \left(\frac{R3+R4}{R4} V_{O\_Sense} + V_F\right) \frac{N_S}{N_A} L_P I^*_{out}}}{\frac{R1+R2}{R2} V_{IN\_Sense}} \quad (15)$$

In the present embodiment, from formula (15) it can be seen that, the control module can calculate the corresponding turn-on time $t_{on}$ of switch M according to the values of $V_{IN\_Sense}$ and $V_{O\_Sense}$, so as to achieve the purpose of controlling the output current $I_{out}$.

Figure 4:
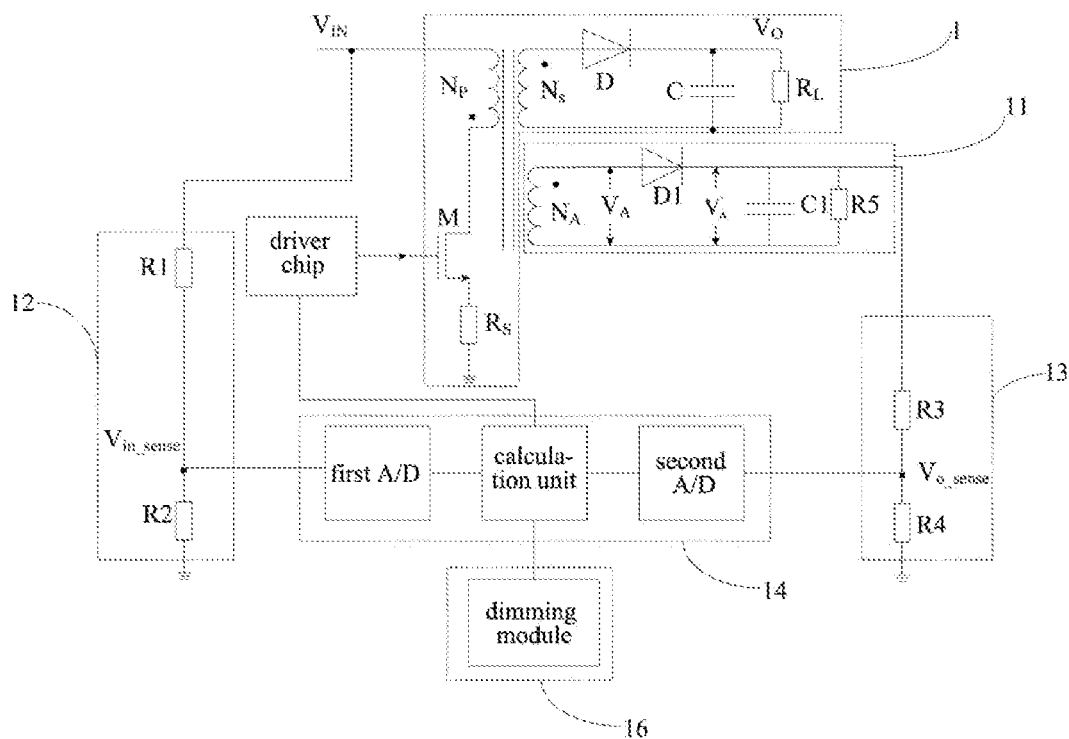
FIG. 4 is a topology diagram of a control circuit of a flyback converter according to another embodiment of the present application.

FIG. 4 is a topology diagram of a control circuit of a flyback converter according to another embodiment of the present application. As shown in FIG. 4, the control circuit further includes a dimming module 16, and the dimming module 16 is coupled to the control module 14, and configured to output a dimming signal $D_{Dim}$ to the control module 14. Most of the other structures in FIG. 4 are the same as those in FIG. 3, which are not described herein.

The dimming signal $D_{Dim}$ reflects an expected value $I^*_{out}$ of the output current, and a turn-on time $t_{on}\_Dim$ during dimming can be obtained according to formula (16).

According to the topology structure of the circuit shown in FIG. 4, the turn-on time $t_{on}\_Dim$ during dimming is calculated as follows, where k is a constant:

$$t_{on}\_Dim = \frac{\sqrt{2t_s \left(\frac{R3+R4}{R4} V_{O\_Sense} + V_F\right) \frac{N_S}{N_A} L_P D_{Dim} k}}{\frac{R1+R2}{R2} V_{IN\_Sense}} \quad (16)$$

Figure 5:
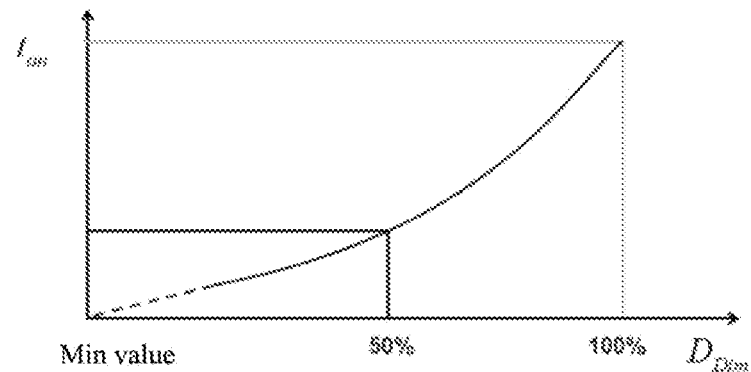
FIG. 5 is a curve diagram of a relationship between a turn-on time of a switch and a dimming signal.
Figure 6:
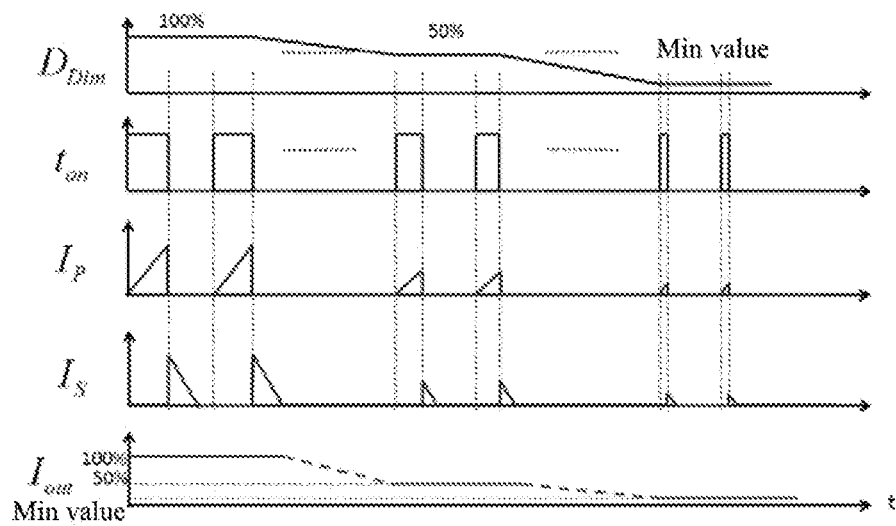
FIG. 6 is a schematic diagram of a dimming waveform.

FIG. 5 is a curve diagram of a relationship between a turn-on time of the switch and a dimming signal $D_{Dim}$. FIG. 6 is a diagram of the dimming waveform. As shown in FIG. 5-FIG. 6, the control module calculates $t_{on}\_Dim$ through formula (16) according to the dimming signal $D_{Dim}$, and sends $t_{on}\_Dim$ to the driver module to control the turn-on and turn-off of the switch, so as to generate the primary side current and the secondary side current of the flyback converter, thereby obtaining different output currents after dimming.

It should be noted that the control circuit shown in FIG. 2 may also include a dimming circuit, and the present application is not limited thereto.

Alternatively, the control module 14 further includes a storage module, and circuit parameters of the flyback converter are stored in the storage module.

Where the storage module may be, for example, a storage, such as a disk storage, a memory stick, and the like, and the present application is not limited thereto.

Figure 7:
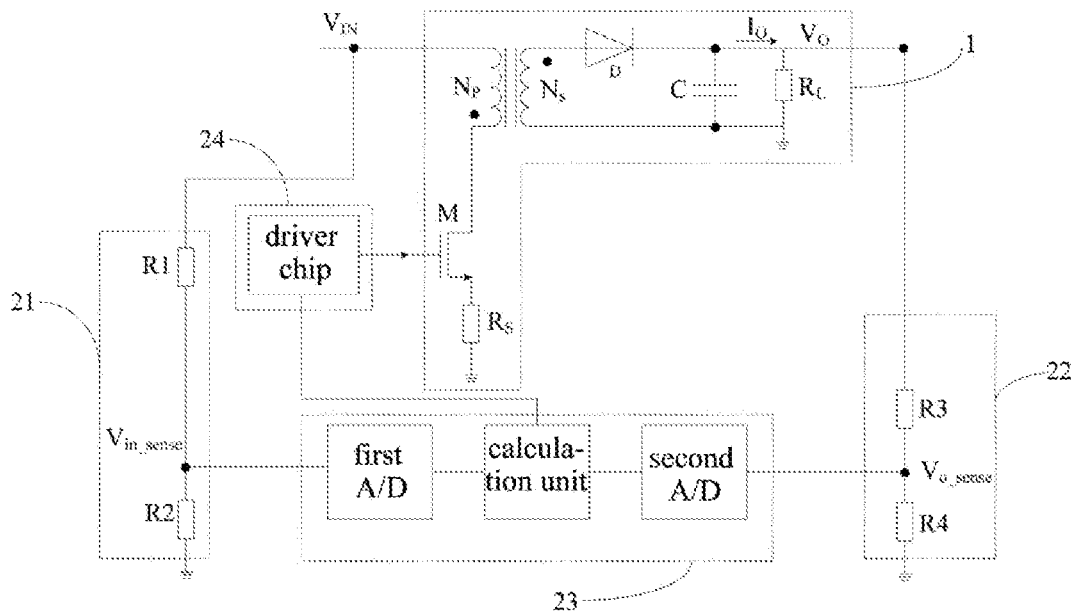
FIG. 7 is a topology diagram of a control circuit of a flyback converter according to another embodiment of the present application.

FIG. 7 is a topology diagram of a control circuit of a flyback converter provided by another embodiment of the present application. As shown in FIG. 7, the flyback converter is a non-isolated flyback converter. The difference between the isolated flyback converter shown in FIG. 1-1 and the non-isolated flyback converter herein is that the primary side and secondary side of the non-isolated flyback converter are commonly grounded, and the similar part therebetween will not be repeated.

The topology structure of the control circuit of the non-isolated flyback converter includes a first sampling module 21, a second sampling module 22 and a control module 23, where the first sampling module 21 is coupled to the primary side winding of the flyback converter 1; the second sampling module 22 is coupled to the secondary side winding of the flyback converter 1; the control module 23 is respectively coupled to the first sampling module 21 and the second sampling module 22, and receives a first voltage signal provided by the first sampling module 21 and a second voltage signal provided by the second sampling module 22. The control module 23 outputs a control signal according to the first voltage signal and the second voltage signal, and the control signal reflects a turn-on time of the switch of the flyback converter 1; where the first voltage signal reflects an input voltage $V_{IN}$ of the flyback converter, and the second voltage signal reflects an output voltage $V_O$ of the flyback converter.

Alternatively, the control module 23 includes: a first A/D conversion module, an calculation unit and a second A/D conversion module; where the first A/D conversion module is respectively coupled to a first sampling module and the calculation unit; the second A/D conversion module is respectively coupled to the second sampling module and the calculation unit; the calculation unit is respectively coupled to the first A/D conversion module and the second A/D conversion module; the first A/D converts the first voltage signal into a first digital signal and outputs the first digital signal to the calculation unit; the second A/D conversion module converts the second voltage signal into a second digital signal and outputs the second digital signal to the calculation unit. The calculation unit can calculate the turn-on time of the switch in the flyback converter according to the first digital signal and the second digital signal, so as to control the output current of the flyback converter.

Where the calculation unit may be a microprocessor, such as a CPU or an MCU. Of course, the control module 23 may also adopt other microprocessor.

Alternatively, the first sampling module 21 includes a first resistor R1 and a second resistor R2. Where one end of the first resistor R1 is coupled to an input end of the flyback converter, and the other end of the first resistor R1 is coupled to the second resistor R2; one end of second resistor R2 is coupled to the first resistor R1, the other end of the second resistor R2 is grounded, and a coupling point between the first resistor R1 and the second resistor R2 is coupled to the control module. After the input voltage $V_{IN}$ is divided by the first resistor R1 and the second resistor R2, the divided voltage is provided to the control module, that is, the first voltage signal $V_{IN\_Sense}$ is output to the control module.

Alternatively, referring still to FIG. 7, the second sampling module 22 includes a third resistor R3 and a fourth resistor R4; where one end of the third resistor R3 is coupled to an output end of the flyback converter, the other end of the third resistor R3 is coupled to the fourth resistor R4; one end of the resistor R4 is coupled to the third resistor R3, the other end of the fourth resistor R4 is grounded, and a coupling point between the third resistor R3 and the fourth resistor R4 is coupled to the control module 23; after output voltage $V_O$ is divided by the third resistors R3 and the fourth resistor R4, the divided voltage is output to the control module, that is, the second voltage signal $V_{O\_Sense}$ is output to the control module.

Specifically, according to formula (11-2), formula (17) can be obtained:

$$t_{on} = \frac{\sqrt{2t_s\left(\frac{R3+R4}{R4}V_{O\_Sense} + V_F\right)L_P I^*_{out}}}{\frac{R1+R2}{R2}V_{IN\_Sense}} \quad (17)$$

In the present embodiment, it can be known from formula (17) that the control module can calculate a corresponding turn-on time $t_{on}$ of the switch according to $V_{IN\_Sense}$ and $V_{O\_Sense}$, so as to achieve the purpose of controlling the output current $I_{out}$.

Alternatively, as shown in FIG. 7, the control circuit further includes a driver module 24, which may be a driver chip or other driver circuits, and the present application is not limited thereto. The driver module 24 is respectively coupled to a control module 23 and the flyback converter 1, and the driver module 24 converts the control signal output by the control module 23 into a driver signal, so as to drive the switch M in the flyback converter 1 to be turned-on and turned-off.

Alternatively, the control module 23 further includes a storage module, and the circuit parameters of the flyback converter are stored in the storage module, where the storage module may be, for example, a storage, such as a disk storage, a memory stick, and the like, and the present application is not limited thereto.

In summary, comparing with the control circuit of the isolated flyback converter shown in FIG. 2 to FIG. 4, the control circuit of the non-isolated flyback converter shown in FIG. 7 can obtain the second voltage signal without the primary side auxiliary circuit.

Figure 8:
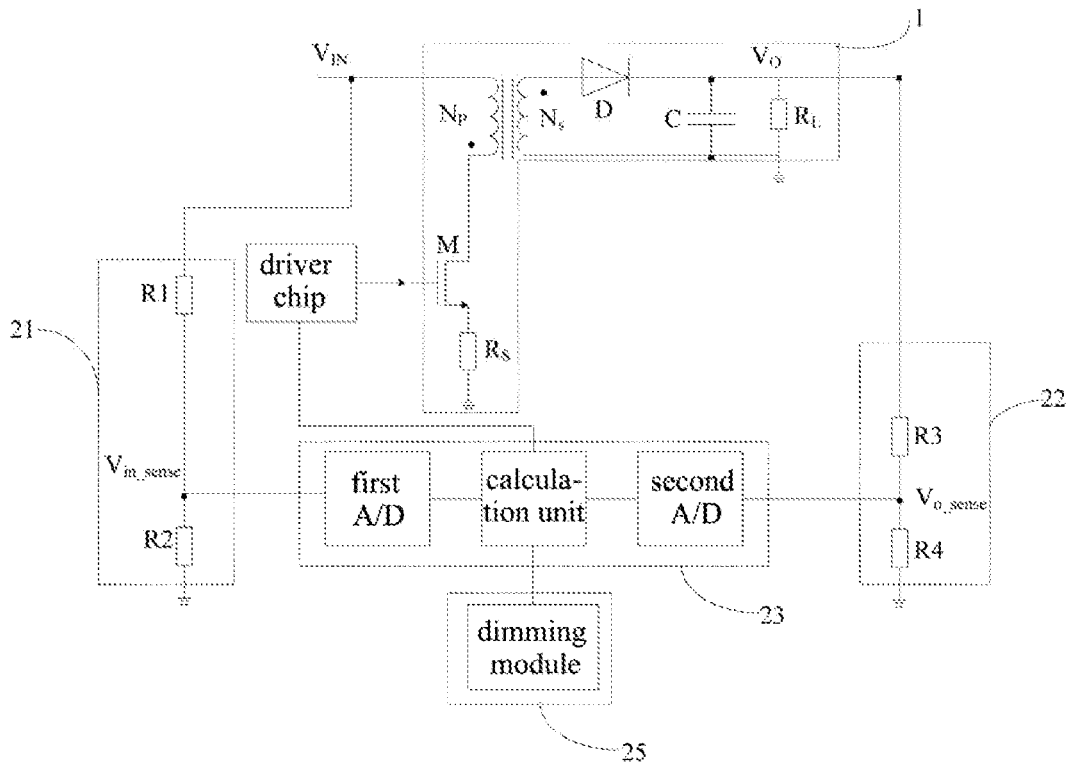
FIG. 8 is a topology diagram of control circuit of a flyback converter according to another embodiment of the present application.

FIG. 8 is a topology diagram of a control circuit of a flyback converter provided by another embodiment of the present application. As shown in FIG. 8, the control circuit further includes a dimming module 25, and the dimming module 25 is coupled to a control module 23 for outputting a dimming signal $D_{Dim}$ to the control module 23. The control module 23 outputs a control signal according to the dimming signal, the first voltage signal and the second voltage signal, and the control signal reflects the turn-on time of the switch in the flyback converter. In addition, most of the other structures of FIG. 8 are same to those of FIG. 7, which will not be repeated here.

Similar to the control circuit shown in FIG. 4, the dimming signal $D_{Dim}$ in FIG. 8 also reflects the expected value $I^*_{out}$ of the output current. According to formula (16), the turn-on time $t_{on}\_Dim$ during dimming can be obtained.

According to the circuit topology structure in FIG. 8, the turn-on time $t_{on}\_Dim$ during dimming is calculated as follows, where k is a constant:

$$t_{on}\_Dim = \frac{\sqrt{2t_s\left(\frac{R3+R4}{R4}V_{O\_Sense} + V_F\right)L_P D_{Dim} k}}{\frac{R1+R2}{R2}V_{IN\_Sense}} \quad (18)$$

where $t_{on}\_Dim$ is a turn-on time of the switch when there is a dimming signal, $V_F$ is a voltage of the diode in the secondary side winding of the flyback converter, $D_{Dim}$ is an instruction signal, k is a constant, R1 is a resistance value of the first resistor, R2 is a resistance value of the second resistor, R3 is a resistance value of the third resistor, R4 is a resistance value of the fourth resistor, $V_{IN\_Sense}$ is a first voltage signal, $V_{O\_Sense}$ is a second voltage signal, $L_P$ is an inductance of the primary side winding of the flyback converter, and $t_s$ is the switching cycle of the switch.

Figure 9:
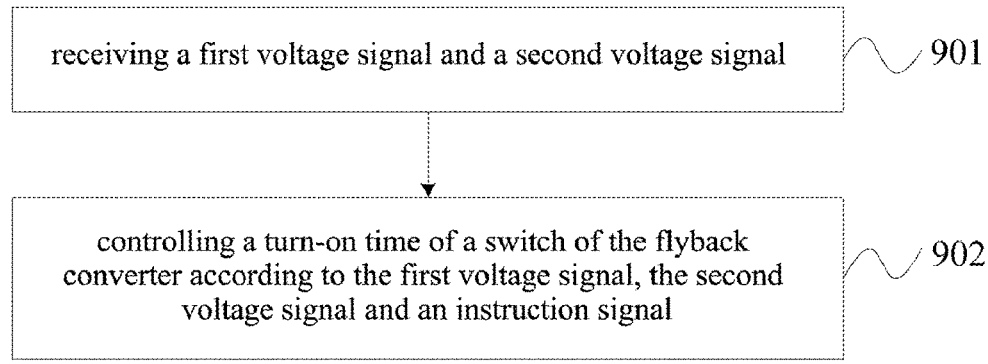
FIG. 9 is a flowchart of a control method of a flyback converter according to a first embodiment of the present application.

FIG. 9 is a flowchart of a control method of a flyback converter provided by a first embodiment of the present application, which may be performed by a control circuit of a flyback converter. The method includes:

step 901, receiving a first voltage signal and a second voltage signal.

Where the first voltage signal reflects an input voltage of the flyback converter, and the second voltage signal reflects an output voltage of the flyback converter.

step 902, controlling a turn-on time of a switch of the flyback converter according to the first voltage signal, second voltage signal and an instruction signal.

Where, the instruction signal reflects an expected value of the output current of the flyback converter.

It can be seen from the foregoing mentioned that formula (11-2) can reflect the relationship between the output current of the flyback converter and the turn-on time of the switch:

$$t_{on} = \frac{\sqrt{2t_s(V_o + V_F)L_P I^*_{out}}}{V_{IN}} \qquad (11\text{-}2)$$

Where $t_{on}$ is the turn-on time of the switch, $t_s$ is an switching cycle of the switch, $V_O$ is an output voltage of the flyback converter, $V_{IN}$ is an input voltage of the flyback converter, $V_F$ is a turn-on voltage drop of the secondary diode of the flyback converter, $L_P$ is an inductance of the primary side winding of the flyback converter, and $I^*_{out}$ is an expected value of the output current.

Therefore, according to the above formula, the control method in this embodiment can control the turn-on time of the switch according to the first voltage signal reflecting the input voltage $V_{IN}$, the second voltage signal reflecting the output voltage $V_O$, and the instruction signal reflecting the expected value $I^*_{Out}$ of the output current, so as to control the output current of the circuit, thus avoiding an error on the current sampling in the prior art, improving the control accuracy of the output current, and satisfying the requirement of the practical application.

Alternatively, referring to FIG. 2, the step of receiving the first voltage signal reflecting the input voltage $V_{IN}$ further includes: collecting the first voltage signal through a first sampling module 12; where the first sampling module 12 includes a first resistor R1 and a second resistor R2; one end of the first resistor R1 is coupled to an input end of the flyback converter, and the other end of the first resistor R1 is coupled to the second resistor R2; one end of the second resistor R2 is coupled to the first resistor R1, the other end of the second resistor R2 is grounded, and a coupling point between the first resistor R1 and the second resistor R2 outputs the first voltage signal $V_{IN\_Sense}$.

Alternatively, as shown in FIG. 2, for an isolated flyback converter, the step of receiving the second voltage signal reflecting the output voltage of the flyback converter further includes: collecting the second voltage signal through a second sampling module 13 and a primary side auxiliary circuit 11, where the primary side auxiliary circuit 11 may include an auxiliary winding, a diode D1, and a capacitor C1; an anode of the diode D1 is coupled to a first end of the auxiliary winding, the cathode of the diode D1 is coupled to one end of the capacitor C1, and the other end of the capacitor C1 is coupled to a second end of the auxiliary winding; the second sampling module 13 includes a third resistor R3 and a fourth resistor R4; one end of the third resistor R3 is coupled to a first end of the auxiliary winding, the other end of the third resistor R3 is coupled to the fourth resistor R4; one end of the fourth resistor R4 is coupled to the third resistor R3, the other end of the fourth resistor R4 is grounded, and a coupling point between the third resistor R3 and the fourth resistor R4 outputs the second voltage signal $V_{O\_Sense}$.

Based on the circuit shown in FIG. 2, the turn-on time of the switch is calculated as follows:

$$t_{on} = \frac{\sqrt{2t_s \dfrac{R3+R4}{R4} V_{O\_Sense} \dfrac{N_S}{N_A} L_P I^*_{out}}}{\dfrac{R1+R2}{R2} V_{IN\_Sense}} \qquad (12)$$

Where, R1 is a resistance value of the first resistor, R2 is a resistance value of the second resistor, R3 is a resistance value of the third resistor, R4 is a resistance value of the fourth resistor, $V_{IN\_Sense}$ is the first voltage signal, $V_{O\_Sense}$ is the second voltage signal, $N_S$ is the number of turns of the secondary side winding of the flyback converter, $N_A$ is the number of turns of the auxiliary winding of the flyback converter, $L_P$ is an inductance of the primary side winding of the flyback converter, $I^*_{Out}$ is an expected value of the output current of the flyback converter, and $t_s$ is an switching cycle of the switch.

Alternatively, referring to FIG. 3, for an isolated flyback converter, the step of receiving the second voltage signal reflecting the output voltage $V_O$ further includes: collecting a second voltage signal through a second sampling module 13 and a primary side auxiliary circuit 11, where the primary side auxiliary circuit 11 includes an auxiliary winding, a diode D1 and a capacitor C1; the second sampling module 13 includes a third resistor R3 and a fourth resistor R4; one end of the third resistor R3 is coupled to the cathode of the diode D1, the other end of the third resistor R3 is coupled to the fourth resistor R4; one end of the fourth resistor R4 is coupled to the third resistor R3, the other end of the fourth resistor R4 is grounded, and a coupling point between the third resistor R3 and the fourth resistor R4 outputs the second voltage signal $V_{O\_Sense}$. The second sampling module may further include a fifth resistor R5, and the fifth resistor R5 and a capacitor C1 are coupled in parallel. The diode D1, the capacitor C1, and the resistor R5 can be used to smooth the second sampling voltage to prevent sampling to an oscillation point.

In addition, on the basis of the circuit shown in FIG. 3, the number of turns of the auxiliary winding of the primary side can be set to be the same as the number of turns of the secondary side winding of flyback converter, and the turn-on voltage drop of the diode D1 of the primary side auxiliary winding can be set to be the same as the turn-on voltage drop of the secondary side diode D of the flyback converter, then the turn-on time of the switch is calculated as follows:

$$t_{on} = \frac{\sqrt{2t_s\left(\frac{R3+R4}{R4}V_{O\_Sense} + V_F\right)\frac{N_S}{N_A}L_P I^*_{out}}}{\frac{R1+R2}{R2}V_{IN\_Sense}} \quad (15)$$

where, R1 is a resistance value of the first resistor, R2 is a resistance value of the second resistor, R3 is a resistance value of the third resistor R4 is a resistance value of the fourth resistor $V_{IN\_Sense}$ is the first voltage signal, $V_{O\_Sense}$ is the second voltage signal, $N_S$ is the number of turns of the secondary side winding of the flyback converter, $N_A$ is the number of turns of the auxiliary winding of the flyback converter, $L_P$ is an inductance of the primary side winding of the flyback converter, $I^*_{out}$ is an expected value of the output current of the flyback converter, $V_F$ is a turn-on voltage drop of the secondary side diode of the flyback converter, and $t_s$ is an switching cycle of the switch.

Alternatively, referring to FIG. 7, for a non-isolated flyback converter, the step of receiving the second voltage signal reflecting the output voltage $V_O$ further includes: collecting the second voltage signal through a second sampling module 22; where, one end of the third resistor R3 is coupled to an output end of the flyback converter 1, the other end of the third resistor R3 is coupled to the fourth resistor R4; one end of the fourth resistor R4 is coupled to the third resistor R3, the other end of the fourth resistor R4 is grounded, and a coupling point between the third resistor R3 and the fourth resistor R4 is coupled to the control module 23, and outputs the second voltage signal $V_{O\_Sense}$ to the control module 23.

On the basis of the circuit shown in FIG. 7, a turn-on time of the switch is calculated as follows:

$$t_{on} = \frac{\sqrt{2t_s\left(\frac{R3+R4}{R4}V_{O\_Sense} + V_F\right)L_P I^*_{out}}}{\frac{R1+R2}{R2}V_{IN\_Sense}} \quad (17)$$

where, $t_{on}$ is a turn-on time, R1 is a resistance value of the first resistor, R2 is a resistance value of the second resistor, R3 is a resistance value of the third resistor, R4 is a resistance value of the fourth resistor, $V_{IN\_Sense}$ is the first voltage signal, $V_{O\_Sense}$ is the second voltage signal, $L_P$ is an inductance of the primary side winding of the flyback converter, $I^*_{out}$ is an expected value of the output current of the flyback converter, $V_F$ is a turn-on voltage drop of the secondary side diode of the flyback converter, and $t_s$ is an switching cycle of the switch.

It can be seen from formula (12), formula (15) and formula (17) that, the corresponding $t_{on}$ of the switch M can be provided according to the values of $V_{IN\_Sense}$ and $V_{O\_Sense}$ without sampling the output current, so as to achieve the purpose of controlling the output current.

According to the control method of the flyback converter provided by the embodiments of the present application, a first voltage signal and a second voltage signal are received, and the turn-on time of the switch of the flyback converter is controlled according to the first voltage signal, the second voltage signal and the instruction signal, where the first voltage signal reflects the input voltage of the flyback converter, and the second voltage signal reflects the output voltage of the flyback converter. The control circuit can control the turn-on time of the switch according to the input voltage and the output voltage of the flyback converter, thereby controlling the output current of the circuit, which avoids the error of the current sampling in the prior art, thus improving the control accuracy of the output current and satisfying the requirement of practical application.

Figure 10:
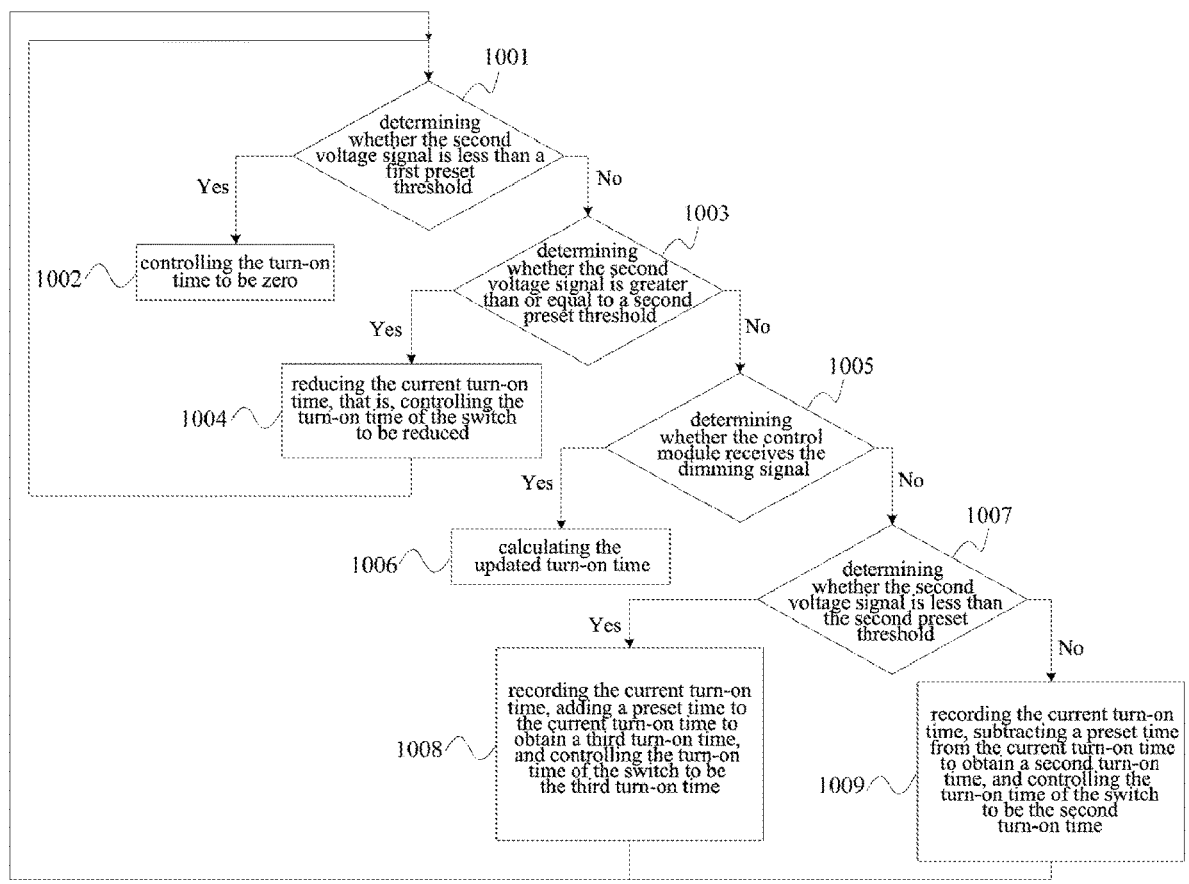
FIG. 10 a flowchart of a control method of a flyback converter according to a second embodiment of the present application.

FIG. 10 a flowchart of a second embodiment of a control method of a flyback converter provided by the present application. In the present embodiment, referring to FIG. 4, the flyback converter can be used for a dimming circuit. The control module 14 is coupled to the dimming module 16, and the dimming module outputs a dimming signal $D_{Dim}$ to the control module 14, where the dimming signal $D_{Dim}$ reflects an expected value $I^*_{out}$ of the output current.

Based on FIG. 4, a detailed description of how to control the turn-on time of the switch of the flyback converter is as follows. The method includes:

step 1001, determining whether the second voltage signal is less than a first preset threshold.

In the present embodiment, the second voltage signal reflects the output voltage of the flyback converter. After the second voltage signal is received, it is determined whether the second voltage signal is less than the first preset threshold, where the first preset threshold may be set according to the actual situation or experience. The specific value of the first preset threshold is not limited herein, and if the second voltage signal is less than the first preset threshold, step 1002 is executed; otherwise, step 1003 is executed.

step 1002, controlling the switch to be turned-off if the second voltage signal is less than the first preset threshold.

In the present embodiment, controlling the switch in the flyback converter to be turned-off if it is determined that the second voltage signal is less than the first preset threshold, so that the turn-on time of the switch is zero.

step 1003, determining whether the second voltage signal is greater than or equal to a second preset threshold.

In the present embodiment, it is determined that whether the second voltage signal is greater than or equal to the second preset threshold if the second voltage signal is not less than the first preset threshold, where the second preset threshold may be set according to the actual situation or the experience. The specific value of the second preset threshold is not limited herein. If the second voltage signal is greater than or equal to the second preset threshold, step 1004 is executed; otherwise, step 1005 is executed.

step 1004, reducing the current turn-on time, that is, controlling the turn-on time of the switch to be reduced, if the second voltage signal is greater than or equal to the second preset threshold.

step 1005, determining whether the control module receives the dimming signal if the second voltage signal is less than the second preset threshold.

In the present embodiment, if it is determined that the control module receives the dimming signal, step 1006 is executed; otherwise, step 1007 is executed.

step 1006: if the control module receives the dimming signal, calculating the updated turn-on time. That is, taking the control circuit shown in FIG. 4 as an example, controlling the turn-on time of the switch as:

$$t_{on}\_Dim = \frac{\sqrt{2t_s\left(\frac{R3+R4}{R4}V_{O\_Sense} + V_F\right)\frac{N_S}{N_A}L_P D_{Dim}k}}{\frac{R1+R2}{R2}V_{IN\_Sense}} \quad (16)$$

Where $t_{on\_Dim}$ is a turn-on time of the switch when there is a dimming signal, $V_F$ is a voltage of the diode of the secondary side winding in the flyback converter, $D_{Dim}$ is an instruction signal, k is a constant, R1 is a resistance value of the first resistor, R2 is a resistance value of the second resistor, R3 is a resistance value of the third resistor, R4 is a resistance value of the fourth resistor, $V_{IN\_Sense}$ is a first voltage signal, $V_{O\_Sense}$ is a second voltage signal, $N_S$ is the number of turns of the secondary side winding of the flyback converter, $N_A$ is the number of turns of the auxiliary winding of the flyback converter, $L_P$ is an inductance of the primary side winding of the flyback converter, and $t_s$ is an switching cycle of the switch.

In the present embodiment, the control module calculates a turn-on time $t_{on\_Dim}$ through formula (16) according to the instruction signal $D_{Dim}$, further, the driver module controls the switch M to be turned-on and turned-off according to the turn-on time, thereby generating primary side current and secondary side current of the flyback converter, further obtaining different output currents after dimming.

step 1007, determining whether the second voltage signal is less than the second preset threshold.

If the second voltage signal is less than the second preset threshold, step 1008 is executed; otherwise, step 1009 is executed.

step 1008, recording the current turn-on time, adding a preset time to the current turn-on time to obtain a third turn-on time, and controlling the turn-on time of the switch to be the third turn-on time.

In the present embodiment, when the second voltage signal is less than the second preset threshold, a third turn-on time is obtained by adding the preset time to the current turn-on time of the switch, and the turn-on time of the switch is controlled to be the third turn-on time.

step 1009, recording the current turn-on time, subtracting a preset time from the current turn-on time to obtain a second turn-on time, and controlling the turn-on time of the switch to be the second turn-on time.

When the output sampling voltage is greater than the second preset threshold, the preset time is subtracted from the current turn-on time of the switch to obtain the second turn-on time, and the turn-on time during dimming of the switch is controlled to be the second turn-on time.

In the present embodiment, the preset time may be set according to the actual situation or experience. The specific value of the preset time is not limited in the present embodiment. According to the control method of the isolated flyback converter provided by the embodiment of the present application, the turn-on time of the switch of the flyback converter is further adjusted according to the second voltage signal, which further satisfies the requirements of practical applications. In other embodiments, the turn-on time of the switch during dimming can also be obtained according to the steps similar to the above steps, and the calculation formula of the turn-on time $t_{on\_Dim}$ can be adjusted accordingly in accordance with different second sampling circuits, and the present application is not limited thereto.

When using the second sampling circuits as shown in FIG. 3, FIG. 4, FIG. 7 and FIG. 8, the dimming accuracy can be further improved since the second voltage signal can more accurately reflect the output voltage of the flyback converter. Meanwhile, the turn-on time of the switch is obtained by sampling the input voltage and the output voltage, thus avoiding the error of the current sampling in the prior art, thereby improving the control accuracy of the output current and improving the dimming accuracy.

Finally, it should be noted that, the above embodiments are merely meant to illustrate rather than limit the technical solutions of the present application; and although the present application has been concretely described in reference to the above embodiments, one with ordinary skill in the art shall understand that modifications can still be made to the technical solutions recorded in each of the foregoing embodiments, or that equivalent substitutions can still be made to part or all of the technical features therein; neither these modifications nor these substitutions shall make the essence of the corresponding technical solutions depart from the scope of the technical solutions in the above embodiments of the present application.

What is claimed is:

1. A control circuit of a flyback converter, comprising:
a first sampling module, a second sampling module, a dimming module and a control module;
the first sampling module being respectively coupled to the control module and the flyback converter, and outputting a first voltage signal to the control module;
the second sampling module being respectively coupled to the control module and the flyback converter, and outputting a second voltage signal to the control module;
the dimming module being coupled to the control module and configured to outputting a dimming signal, as an instruction signal, to the control module;
wherein the first voltage signal reflects an input voltage of the flyback converter, and the second voltage signal reflects an output voltage of the flyback converter; the control module outputs a control signal according to the dimming signal, the first voltage signal and the second voltage signal, and the control signal reflects a turn-on time of a switch in the flyback converter,
wherein the turn-on time of the switch of the flyback converter is calculated according to the instruction signal, an inductance of a primary side winding in the flyback converter, the first voltage signal and the second voltage signal,
wherein the instruction signal reflects an expected value of an output current of the flyback converter,
wherein the first sampling module comprises a first resistor and a second resistor; one end of the first resistor is coupled to an input end of the flyback converter, and the other end of the first resistor is coupled to the second resistor; and one end of the second resistor is coupled to the first resistor, the other end of the second resistor is grounded; a coupling point between the first resistor and the second resistor is coupled to the control module, and outputs the first voltage signal to the control module,
wherein the flyback converter is an isolated flyback converter; the control circuit further comprises a primary side auxiliary circuit, and an auxiliary winding of the primary side auxiliary circuit is wound around a primary side of a transformer of the flyback converter; wherein the second sampling module is coupled to the flyback converter through the primary side auxiliary circuit;
wherein the primary side auxiliary circuit further comprises a diode and a capacitor;
an anode of the diode is coupled to a first end of the auxiliary winding, a cathode of the diode is coupled to one end of the capacitor, and the other end of the capacitor is coupled to a second end of the auxiliary winding;

the second sampling module comprises a third resistor and a fourth resistor;

wherein one end of the third resistor is coupled to a cathode of the diode, the other end of the third resistor is coupled to the fourth resistor; and one end of the fourth resistor is coupled to the third resistor, the other end of the fourth resistor is grounded; a coupling point between the third resistor and the fourth resistor is coupled to the control module, and outputs the second voltage signal to the control module, wherein the number of turns of the auxiliary winding is the same as the number of turns of a secondary side winding of the flyback converter, and/or a turn-on voltage drop of the diode of the primary side auxiliary circuit is the same as a turn-on voltage drop of a secondary side diode of the flyback converter;

wherein the turn-on time is calculated as follows:

$$t_{on\_}\text{Dim} = \frac{\sqrt{2t_s\left(\frac{R3+R4}{R4}V_{O\_Sense}+V_F\right)\frac{N_S}{N_A}L_P D_{Dim}k}}{\frac{R1+R2}{R2}V_{IN\_Sense}}$$

wherein, $t_{on\_}$Dim is the turn-on time, $V_F$ is the turn-on voltage drop of the secondary diode of the flyback converter, $D_{Dim}$ is the dimming signal, k is a constant, R1 is the resistance value of the first resistor, R2 is the resistance value of the second resistor, R3 is the resistance value of the third resistor, R4 is the resistance value of the fourth resistor, $V_{IN\_Sense}$ is the first voltage signal, $V_{O\_Sense}$ is the second voltage signal, $N_S$ is the number of turns of the secondary side winding of the flyback converter, $N_A$ is the number of turns of the auxiliary winding, $L_P$ is the inductance of the primary side winding of the flyback converter, and $t_s$ is the switching cycle of the switch.

2. The control circuit according to claim 1, wherein the control module comprises: a first A/D conversion module, a calculation unit and a second A/D conversion module; wherein, the first A/D conversion module is respectively coupled to the first sampling module and the calculation unit;

the second A/D conversion module is respectively coupled to the second sampling module and the calculation unit;

the first A/D conversion module receives the first voltage signal, and correspondingly outputs a first digital signal to the calculation unit;

the second A/D conversion module receives the second voltage signal, and correspondingly outputs a second digital signal to the calculation unit; and the calculation unit is configured to calculate the turn-on time of the switch in the flyback converter according to the first digital signal and the second digital signal.

3. The control circuit according to claim 1, further comprising a driving module, the driving module is respectively coupled to the control module and the flyback converter, wherein the driving module converts the control signal output by the control module to a driving signal, so as to drive the switch in the flyback converter to be turned-on and turned-off.

4. The control circuit according to claim 1, wherein the control module further comprises a storage module, and a circuit parameter of the flyback converter is stored in the storage module.

5. A control method of a flyback converter, comprising:
receiving a first voltage signal and a second voltage signal;
receiving a dimming signal as an instruction signal; and
calculating a turn-on time of a switch of the flyback converter according to the instruction signal, an inductance of a primary side winding in the flyback converter, the first voltage signal and the second voltage signal,
wherein the first voltage signal reflects an input voltage of the flyback converter, the second voltage signal reflects an output voltage of the flyback converter, and the instruction signal reflects an expected value of an output current of the flyback converter,
wherein the step of receiving the first voltage signal further comprises:
collecting the first voltage signal through a first sampling module;
wherein the first sampling module comprises a first resistor and a second resistor; one end of the first resistor is coupled to an input end of the flyback converter, the other end of the first resistor is coupled to the second resistor; one end of the second resistor is coupled to the first resistor, the other end of the second resistor is grounded, and a coupling point between the first resistor and the second resistor outputs the first voltage signal,
wherein the flyback converter is an isolated converter, and the step of receiving the second voltage signal further comprises:
collecting the second voltage signal through a second sampling module and a primary side auxiliary circuit wherein the primary side auxiliary circuit comprises an auxiliary winding, a diode and a capacitor; the auxiliary winding is wound around a primary side of a transformer of the flyback converter; an anode of the diode is coupled to a first end of the auxiliary winding, a cathode of the diode is coupled to one end of the capacitor, and the other end of the capacitor is coupled to a second end of the auxiliary winding;
the second sampling module comprises a third resistor and a fourth resistor;
one end of the third resistor is coupled to the cathode of the diode, and the other end of the third resistor is coupled to the fourth resistor; and
one end of the fourth resistor is coupled to the third resistor, the other end of the fourth resistor is grounded, and a coupling point between the third resistor and the fourth resistor outputs the second voltage signal,
wherein the number of turns of the auxiliary winding is the same as the number of turns of a secondary side winding of the flyback converter, and of a turn-on voltage drop of the diode of the primary side auxiliary circuit is the same as a turn-on voltage drop of a secondary diode of the flyback converter,
the step of controlling the turn-on time of the switch of the flyback converter further comprises:
the turn-on time is calculated as follows:

$$t_{on\_}\text{Dim} = \frac{\sqrt{2t_s\left(\frac{R3+R4}{R4}V_{O\_Sense}+V_F\right)\frac{N_S}{N_A}L_P D_{Dim}k}}{\frac{R1+R2}{R2}V_{IN\_Sense}}$$

wherein, $t_{on}\_Dim$ is the turn-on time, $V_F$ is the turn-on voltage drop of the secondary diode of the flyback converter, $D_{Dim}$ is the dimming signal, k is a constant, R1 is the resistance value of the first resistor, R2 is the resistance value of the second resistor, R3 is the resistance value of the third resistor, R4 is the resistance value of the fourth resistor, $V_{IN\_Sense}$ is the first voltage signal, $V_{O\_Sense}$ is the second voltage signal, $N_S$ the number of turns of the secondary side winding of the flyback converter, $N_A$ is the number of turns of the auxiliary winding, $L_P$ is the inductance of the primary side winding of the flyback converter, and $t_s$ is the switching cycle of the switch.

6. The control method according to claim 5, wherein the step of controlling the turn-on time of the switch of the flyback converter further comprises:
   determining whether the second voltage signal is less than a first preset threshold; and
   controlling the switch to be turned off if the second voltage signal is less than the first preset threshold.

7. The control method according to claim 5, wherein the step of controlling the turn-on time of the switch of the flyback converter further comprises:
   determining whether the second voltage signal is greater than or equal to a second preset threshold;
   reducing the turn-on time of the switch if the second voltage signal is greater than or equal to the second preset threshold;
   determining whether the control module receives the dimming signal if the second voltage signal is less than the second preset threshold; and
   calculating an updated turn-on time if the control module receives the dimming signal.

8. The control method according to claim 7, wherein the step of controlling the turn-on time of the switch of the flyback converter further comprises:
   determining whether the second voltage signal is less than the second preset threshold if the control module does not receive the dimming signal; and
   if the second voltage signal is less than the second preset threshold, recording a current turn-on time, adding a preset time to the current turn-on time to obtain a third turn-on time and controlling the turn-on time of the switch to be the third turn-on time.

9. The control method according to claim 8, wherein the step of controlling the turn-on time of the switch of the flyback converter further comprises:
   if the second voltage signal is greater than the second preset threshold, recording the current turn-on time, subtracting a present time from the current turn-on time to obtain a second turn-on time, controlling the turn-on time of the switch to be the second turn-on time.

* * * * *